US009362215B2

(12) United States Patent
Fernando et al.

(10) Patent No.: US 9,362,215 B2
(45) Date of Patent: Jun. 7, 2016

(54) POWER QUAD FLAT NO-LEAD (PQFN) SEMICONDUCTOR PACKAGE WITH LEADFRAME ISLANDS FOR MULTI-PHASE POWER INVERTER

(71) Applicant: International Rectifier Corporation, El Segundo, CA (US)

(72) Inventors: Dean Fernando, Torrance, CA (US); Roel Barbosa, Sta. Rosa Laguna (PH)

(73) Assignee: Infineon Technologies Americas Corp., El Segundo, CA (US)

( * ) Notice: Subject to any disclaimer, the term of this patent is extended or adjusted under 35 U.S.C. 154(b) by 119 days.

(21) Appl. No.: 14/102,316

(22) Filed: Dec. 10, 2013

(65) Prior Publication Data

US 2014/0091449 A1    Apr. 3, 2014

Related U.S. Application Data

(63) Continuation-in-part of application No. 13/662,244, filed on Oct. 26, 2012, which is a continuation of application No. 13/034,519, filed on Feb. 24, 2011, now Pat. No. 8,587,101.

(60) Provisional application No. 61/774,506, filed on Mar. 7, 2013, provisional application No. 61/459,527, filed on Dec. 13, 2010.

(51) Int. Cl.
*H01L 23/495* (2006.01)
*H01L 23/31* (2006.01)
*H01L 23/00* (2006.01)

(52) U.S. Cl.
CPC ...... *H01L 23/49575* (2013.01); *H01L 23/4952* (2013.01); *H01L 23/49513* (2013.01);

(Continued)

(58) Field of Classification Search
CPC ................. H01L 23/49575; H01L 23/4952; H01L 27/088
See application file for complete search history.

(56) References Cited

U.S. PATENT DOCUMENTS 5,773,883 A    6/1998    Majumdar
5,998,856 A    12/1999    Noda
(Continued)

FOREIGN PATENT DOCUMENTS

CN    102569241    7/2012
EP    2 463 904    6/2012
(Continued)

OTHER PUBLICATIONS

U.S. Appl. No. 61/459,527, filed Dec. 13, 2010, Fernando.
(Continued)

*Primary Examiner* — Peniel M Gumedzoe
(74) *Attorney, Agent, or Firm* — Farjami & Farjami LLP

(57) ABSTRACT

According to an exemplary implementation, a power quad flat no-lead (PQFN) package includes a U-phase output node situated on a first leadframe island of a leadframe, a V-phase output node situated on a second leadframe island of said leadframe, and a W-phase output node situated on a W-phase die pad of said leadframe. The first leadframe island can be on a first leadframe strip of the leadframe, where the first leadframe strip is connected to a U-phase die pad of the leadframe. The second leadframe island can be on a second leadframe strip of the leadframe, where the second leadframe strip is connected to a V-phase die pad of the leadframe. A first W-phase power switch is situated on the W-phase die pad. Furthermore, at least one wirebond is connected to the W-phase die pad and to a source of a second W-phase power switch. The W-phase die pad can be a W-phase output terminal of the PQFN package.

19 Claims, 6 Drawing Sheets

(Top View)

(52) U.S. Cl.
CPC .... *H01L23/49541* (2013.01); *H01L 23/49548* (2013.01); *H01L 23/49562* (2013.01); *H01L 23/3107* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 2224/0603* (2013.01); *H01L 2224/2929* (2013.01); *H01L 2224/29101* (2013.01); *H01L 2224/29339* (2013.01); *H01L 2224/32245* (2013.01); *H01L 2224/45015* (2013.01); *H01L 2224/45144* (2013.01); *H01L 2224/45147* (2013.01); *H01L 2224/48091* (2013.01); *H01L 2224/48137* (2013.01); *H01L 2224/48247* (2013.01); *H01L 2224/4903* (2013.01); *H01L 2224/49113* (2013.01); *H01L 2224/49171* (2013.01); *H01L 2224/49175* (2013.01); *H01L 2224/73265* (2013.01); *H01L 2924/014* (2013.01); *H01L 2924/0105* (2013.01); *H01L 2924/01005* (2013.01); *H01L 2924/01006* (2013.01); *H01L 2924/01029* (2013.01); *H01L 2924/01033* (2013.01); *H01L 2924/01047* (2013.01); *H01L 2924/01079* (2013.01); *H01L 2924/01082* (2013.01); *H01L 2924/1305* (2013.01); *H01L 2924/13055* (2013.01); *H01L 2924/13064* (2013.01); *H01L 2924/13091* (2013.01)

(56) References Cited

U.S. PATENT DOCUMENTS

| | | | |
|---|---|---|---|
| 6,137,165 A | 10/2000 | Thierry | |
| 6,211,549 B1 | 4/2001 | Funaki | |
| 6,249,024 B1 | 6/2001 | Mangtani | |
| 6,313,598 B1 | 11/2001 | Tamba | |
| 6,465,875 B2 | 10/2002 | Connah | |
| 6,610,923 B1 | 8/2003 | Nagashima | |
| 8,803,499 B2 | 8/2014 | Sreenivas | |
| 2001/0045627 A1 | 11/2001 | Connah | |
| 2002/0109211 A1* | 8/2002 | Shinohara | H01L 23/4334 257/666 |
| 2002/0113617 A1 | 8/2002 | Gergintschw | |
| 2003/0006434 A1 | 1/2003 | Kawafuji et al. | |
| 2003/0107120 A1 | 6/2003 | Connah | |
| 2004/0135248 A1 | 7/2004 | Takagawa | |
| 2004/0196678 A1 | 10/2004 | Yoshimura | |
| 2004/0227476 A1 | 11/2004 | Guerra | |
| 2004/0227547 A1 | 11/2004 | Shiraishi | |
| 2005/0054186 A1 | 3/2005 | Kim | |
| 2006/0001318 A1 | 1/2006 | Ahmad | |
| 2006/0043545 A1 | 3/2006 | Yea | |
| 2006/0113664 A1 | 6/2006 | Shiraishi | |
| 2006/0240599 A1 | 10/2006 | Amano | |
| 2007/0064370 A1 | 3/2007 | Kajiwara | |
| 2007/0126092 A1 | 6/2007 | San Antonio | |
| 2007/0200537 A1 | 8/2007 | Akiyama | |
| 2007/0216011 A1* | 9/2007 | Otremba | H01L 23/49503 257/690 |
| 2007/0228534 A1 | 10/2007 | Uno | |
| 2008/0002445 A1 | 1/2008 | Cho | |
| 2008/0023831 A1 | 1/2008 | Nishimura | |
| 2008/0074068 A1 | 3/2008 | Takeuchi | |
| 2008/0150436 A1 | 6/2008 | Suzuki | |
| 2008/0217662 A1 | 9/2008 | Harnden | |
| 2008/0224323 A1* | 9/2008 | Otremba | H01L 23/4952 257/778 |
| 2008/0252372 A1 | 10/2008 | Williams | |
| 2009/0095979 A1* | 4/2009 | Saito | H01L 25/18 257/177 |
| 2009/0212733 A1 | 8/2009 | Hsieh | |
| 2009/0262468 A1 | 10/2009 | Ide | |
| 2009/0321927 A1 | 12/2009 | Nishimura | |
| 2010/0059875 A1 | 3/2010 | Sato | |
| 2010/0127683 A1 | 5/2010 | Uno | |
| 2010/0148590 A1 | 6/2010 | Kojima | |
| 2010/0164419 A1 | 7/2010 | Suh | |
| 2010/0165681 A1 | 7/2010 | Sakano | |
| 2010/0301464 A1* | 12/2010 | Arshad | H01L 23/49503 257/676 |
| 2011/0049685 A1 | 3/2011 | Park | |
| 2011/0110011 A1 | 5/2011 | Dittfeld | |
| 2011/0169102 A1 | 7/2011 | Uno | |
| 2011/0254143 A1 | 10/2011 | Chen | |
| 2012/0126378 A1 | 5/2012 | San Antonio | |
| 2012/0267750 A1 | 10/2012 | Imai et al. | |
| 2012/0273892 A1 | 11/2012 | Uno | |
| 2013/0155745 A1 | 6/2013 | Tanaka | |
| 2014/0131846 A1 | 5/2014 | Shiramizu | |

FOREIGN PATENT DOCUMENTS

| | | |
|---|---|---|
| JP | H 9-102580 | 4/1997 |
| JP | 2001135765 A | 5/2001 |
| JP | 3384399 | 3/2003 |
| JP | 2004147401 | 5/2004 |
| JP | 2005183463 | 7/2005 |
| JP | 2005183463 A | 7/2005 |
| JP | 2009-27090 | 2/2009 |
| JP | 2011-29262 | 2/2011 |
| JP | 2012129489 | 7/2012 |
| JP | 2012-175070 | 9/2012 |
| TW | 201240046 | 10/2012 |
| WO | WO 98/24128 | 6/1998 |

OTHER PUBLICATIONS

U.S. Appl. No. 61/774,484, filed Mar. 7, 2013, Fernando.
U.S. Appl. No. 61/774,506, filed Mar. 7, 2013, Fernando.
U.S. Appl. No. 61/774,535, filed Mar. 7, 2013, Fernando.
U.S. Appl. No. 61/774,541, filed Mar. 7, 2013, Fernando.
U.S. Appl. No. 61/777,341, filed Mar. 12, 2013, Fernando.
U.S. Appl. No. 61/777,753, filed Mar. 12, 2013, Fernando.
U.S. Appl. No. 61/780,069, filed Mar. 13, 2013, Fernando.
U.S. Appl. No. 61/780,417, filed Mar. 13, 2013, Fernando.
U.S. Appl. No. 61/782,460, filed Mar. 14, 2013, Fernando.
U.S. Appl. No. 13/034,519, filed Feb. 24, 2011, Fernando.
U.S. Appl. No. 13/662,244, filed Oct. 26, 2012, Fernando.
U.S. Appl. No. 14/076,467, filed Nov. 11, 2013, Fernando.
U.S. Appl. No. 14/102,275, filed Dec. 10, 2013, Fernando.
U.S. Appl. No. 14/102,379, filed Dec. 10, 2013, Fernando.
U.S. Appl. No. 14/140,285, filed Dec. 24, 2013, Fernando.
U.S. Appl. No. 14/147,464, filed Jan. 3, 2014, Fernando.
U.S. Appl. No. 14/150,469, filed Jan. 8, 2014, Fernando.
U.S. Appl. No. 14/152,640, filed Jan. 10, 2014, Fernando.
U.S. Appl. No. 14/152,723, filed Jan. 10, 2014, Fernando.
U.S. Appl. No. 14/152,816, filed Jan. 10, 2014, Fernando.

* cited by examiner (Top View)

(Top View)

(Bottom View)

POWER QUAD FLAT NO-LEAD (PQFN) SEMICONDUCTOR PACKAGE WITH LEADFRAME ISLANDS FOR MULTI-PHASE POWER INVERTER

The present application claims the benefit of and priority to provisional application Ser. No. 61/774,506, filed on Mar. 7, 2013, and entitled "Power Quad Flat No-Lead (PQFN) Semiconductor Package with Leadframe Islands for Multi-Phase Power Inverter." The present application is also a continuation-in-part of application Ser. No. 13/662,244 filed on Oct. 26, 2012, and entitled "Compact Wirebonded Power Quad Flat No-Lead (PQFN) Package," which in turn claims priority to application Ser. No. 13/034,519 filed on Feb. 24, 2011, and entitled "Multi-Chip Module (MCM) Power Quad Flat No-Lead (PQFN) Semiconductor Package Utilizing a Leadframe for Electrical Interconnections," which in turn claims priority to provisional application Ser. No. 61/459,527 filed on Dec. 13, 2010, and entitled "Low Cost Leadframe Based High Power Density Full Bridge Power Device." The present application claims the benefit of and priority to all of the above-identified applications. Moreover, the disclosure and contents of all of the above-identified applications are hereby incorporated fully by reference into the present application.

BACKGROUND

I. Definition

As used herein, the phrase "group III-V" refers to a compound semiconductor including at least one group III element and at least one group V element. By way of example, a group III-V semiconductor may take the form of a III-Nitride semiconductor. "III-Nitride", or "III-N", refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium. A group III-V or a GaN transistor may also refer to a composite high voltage enhancement mode transistor that is formed by connecting the group III-V or the GaN transistor in cascode with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

II. Background Art

Packages combining several semiconductor devices can simplify circuit design, reduce costs, and provide greater efficiency and improved performance by keeping related and dependent circuit components in close proximity. Furthermore, these packages can facilitate application integration and greater electrical and thermal performance compared to using separate packaging for components.

Quad flat no-lead (QFN) packages are leadless packages for electrical components, such as power semiconductor devices. The QFN packages can utilize a leadframe and wirebonds for connection to the electrical components housed therein. The QFN packages often have limited complexity and electrical routing can be challenging, particularly for more complex configurations. Thus, QFN packages often have simple configurations and house a small number of electrical components.

SUMMARY

A power quad flat no-lead (PQFN) semiconductor package with leadframe islands for multi-phase power inverter, substantially as shown in and/or described in connection with at least one of the figures, and as set forth more completely in the claims.

DETAILED DESCRIPTION

Figure 1A:
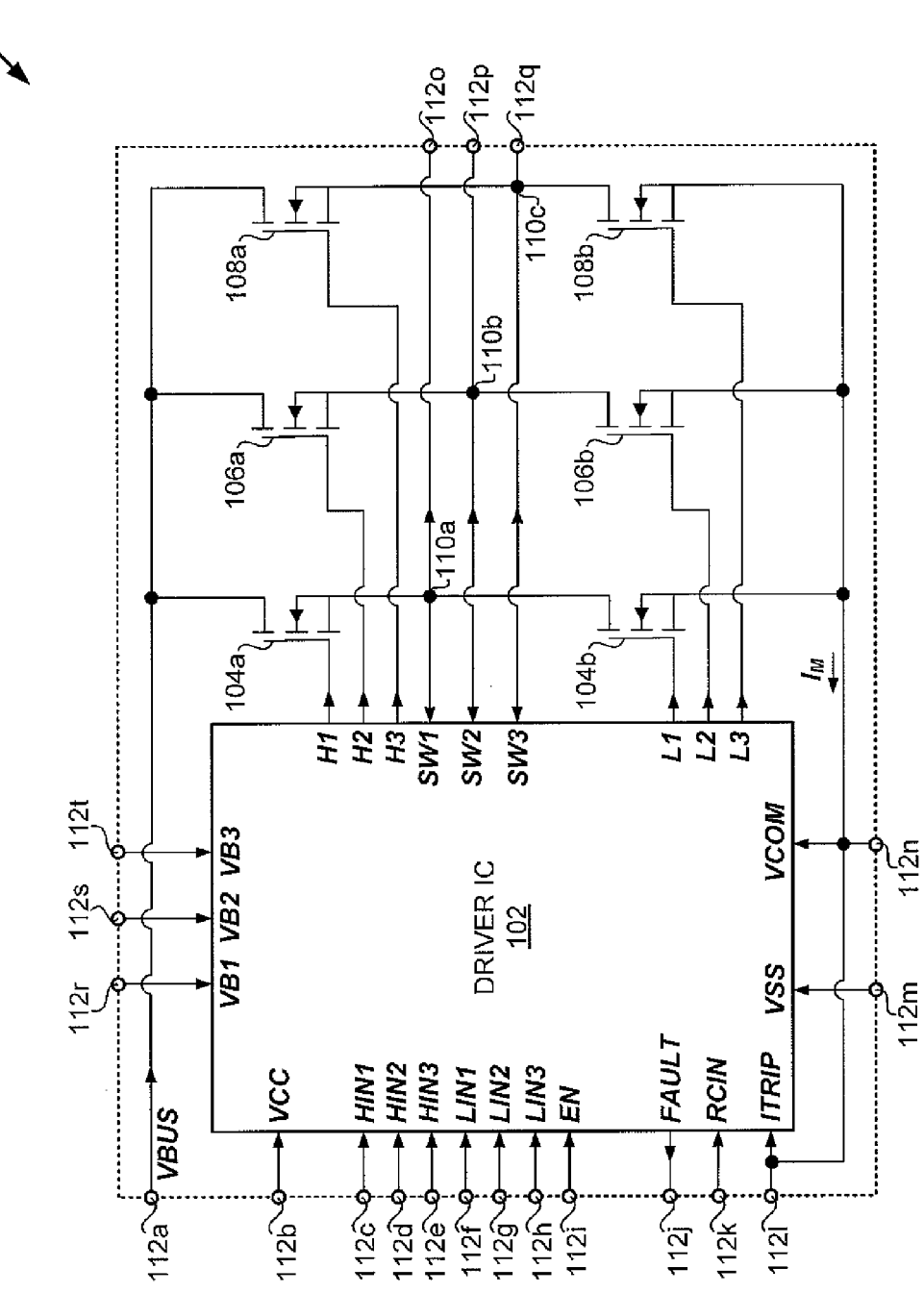
FIG. 1A illustrates a schematic diagram of an exemplary circuit of a power quad flat no-lead (PQFN) package.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1B:
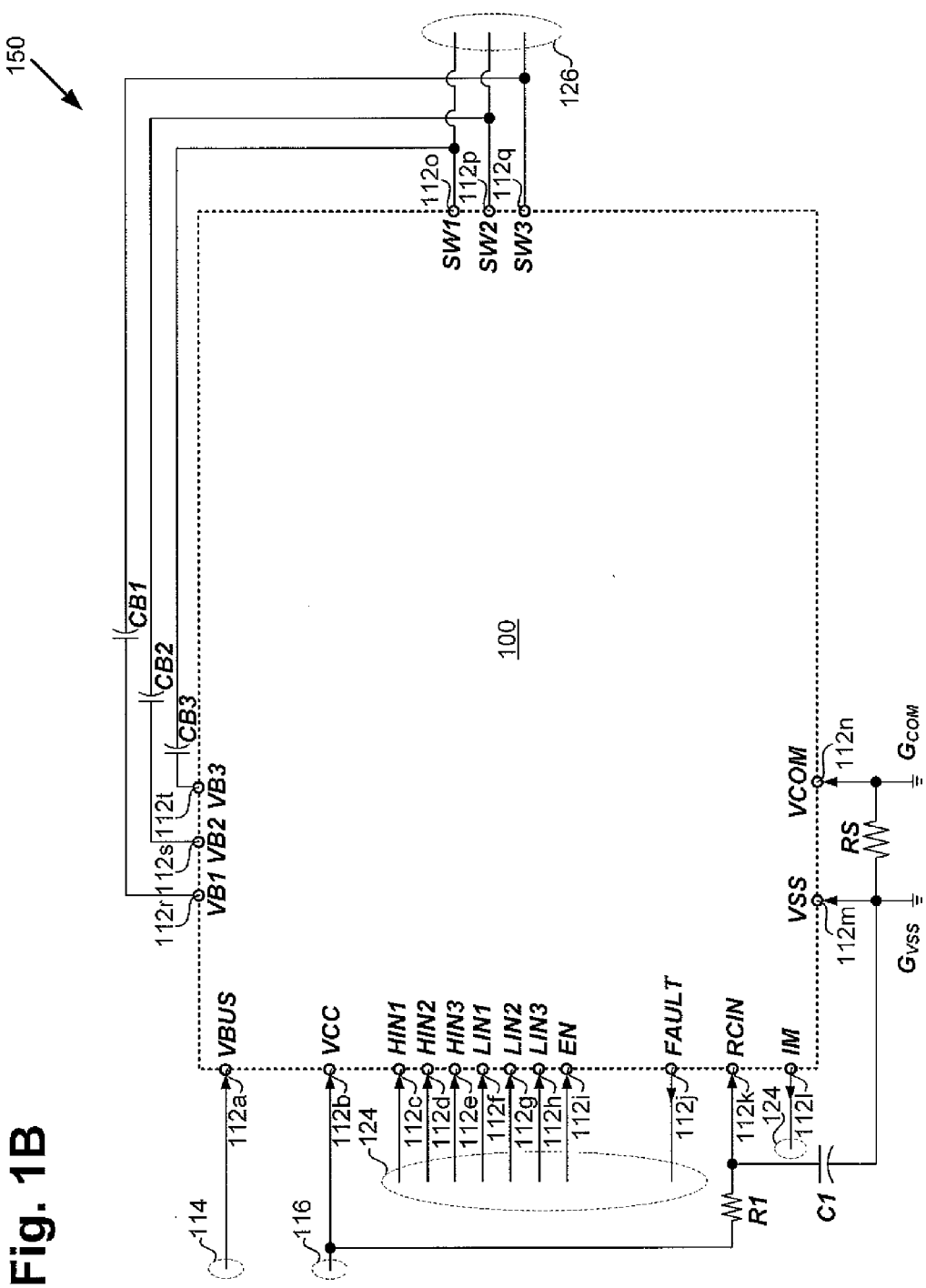
FIG. 1B illustrates a schematic diagram of a PQFN package in an exemplary multi-phase power inverter circuit.

FIG. 1A illustrates a schematic diagram of an exemplary circuit of power quad flat no-lead (PQFN) package 100. FIG. 1B illustrates a schematic diagram of PQFN package 100 in multi-phase power inverter circuit 150.

Referring to FIGS. 1A and 1B, PQFN package 100 includes driver integrated circuit (IC) 102, U-phase power switches 104a and 104b, V-phase power switches 106a and 106b, and W-phase power switches 108a and 108b. In multi-phase power inverter circuit 150 of FIG. 1B, PQFN package 100 is connected to bus voltage source 114, supply voltage source 116, microcontroller 124, motor 126, resistor R1, capacitor C1, bootstrap capacitors CB1, CB2, CB3, and shunt resistor RS. Any of PQFN package 100, microcontroller 124, motor 126, resistor R1, capacitor C1, bootstrap capacitors CB1, CB2, CB3, and shunt resistor RS can be mounted on a printed circuit board (PCB). Furthermore, PQFN package 100 can be connected to any of bus voltage source 114, supply voltage source 116, microcontroller 124, motor 126, resistor R1, capacitor C1, bootstrap capacitors CB1, CB2, CB3, and shunt resistor RS through conductive leads on the PCB.

PQFN package 100 also includes VBUS terminal 112a, VCC terminal 112b, HIN1 terminal 112c, HIN2 terminal 112d, HIN3 terminal 112e, LIN1 terminal 112f, LIN2 terminal 112g, LIN3 terminal 112h, EN terminal 112i, FAULT terminal 112j, RCIN terminal 112k, IM terminal 112l, VSS terminal 112m, VCOM terminal 112n, SW1 terminal 112o, SW2 terminal 112p, SW3 terminal 112q, VB1 terminal 112r, VB2 terminal 112s, and VB3 terminal 112t, which are collectively referred to as I/O terminals 112.

In PQFN package 100, VBUS terminal 112a receives VBUS as input from bus voltage source 114. VCC terminal 112b receives VCC as input to driver IC 102 from supply voltage source 116. HIN1 terminal 112c, HIN2 terminal 112d, and HIN3 terminal 112e receive HIN1, HIN2, and HIN3 respectively as inputs to driver IC 102 from microcontroller 124. LIN1 terminal 112f, LIN2 terminal 112g, and LIN3 terminal 112h receive LIN1, LIN2, and LIN3 respectively as inputs to driver IC 102 from microcontroller 124. EN terminal 112i receives EN as input to driver IC 102 from microcontroller 124. FAULT terminal 112j receives FAULT as output from driver IC 102 to microcontroller 124. RCIN terminal 112k receives RCIN as input to driver IC 102 from resistor R1 and capacitor C1. IM terminal 112l receives ITRIP as input to driver IC 102 and microcontroller 124 from U-phase power switch 104b, V-phase power switch 106b, and W-phase power switch 108b. VSS terminal 112m receives VSS as input to driver IC 102 from logic ground $G_{VSS}$. VCOM terminal 112n receives VCOM as input to driver IC 102, U-phase power switch 104b, V-phase power switch 106b, and W-phase power switch 108b from power ground $G_{COM}$. SW1 terminal 112o receives SW1 from U-phase output node 110a as output to motor 126. Driver IC 102 also receives SW1 as input from U-phase output node 110a. SW2 terminal 112p receives SW2 from V-phase output node 110b as output to motor 126. Driver IC 102 also receives SW2 as input from V-phase output node 110b. SW3 terminal 112q receives SW3 from W-phase output node 110c as output to motor 126. Driver IC 102 also receives SW3 as input from W-phase output node 110c. VB1 terminal 112r receives VB1 as input to driver IC 102 from bootstrap capacitor CB1. VB2 terminal 112s receives VB2 as input to driver IC 102 from bootstrap capacitor CB2. VB3 terminal 112t receives VB3 as input to driver IC 102 from bootstrap capacitor CB3.

It will be appreciated that in various implementations, the number, quantity, and location of I/O terminals 112 are different than what is shown. For example, in various implementations, a driver IC that is different than driver IC 102 can be utilized, which can have different capabilities and/or I/O requirements than driver IC 102. This may be reflected in I/O terminals 112 as well as other connections of PQFN package 100. As one specific example, in one implementation, driver IC 102 is instead a functionally integrated IC that incorporates functionality of driver IC 102 and microcontroller 124. Thus, additional I/O terminals 112 may be required for functionality of microcontroller 124, while certain I/O terminals 112, such as FAULT terminal 112j may not be required.

PQFN package 100 is for a multi-phase power inverter and driver IC 102 can be a high voltage IC (HVIC) for driving U-phase power switches 104a and 104b, V-phase power switches 106a and 106b, and W-phase power switches 108a and 108b, which are in a full bridge configuration. Examples of driver IC 102 include "5$^{th}$ generation" HVICs available from International Rectifier Corporation®. In the present implementation, U-phase power switches 104a and 104b, V-phase power switches 106a and 106b, and W-phase power switches 108a and 108b are vertical conduction power devices, for example, group IV semiconductor power metal-oxide-semiconductor field effect transistors (power MOSFETs) such as fast-reverse epitaxial diode field effect transistors (FREDFETs), or group IV semiconductor insulated-gate bipolar transistors (Ian's). In other implementations group III-V semiconductor FETs, HEMTs (high electron mobility transistors) and, in particular, GaN FETs and/or HEMTs can be used as power devices in U-phase power switches 104a and 104b, V-phase power switches 106a and 106b, and W-phase power switches 108a and 108b. As defined above, Gallium nitride or GaN, as used herein, refers to a III-Nitride compound semiconductor wherein the group III element or elements include some or a substantial amount of gallium, but may also include other group III elements in addition to gallium. As previously stated, a group III-V or a GaN transistor may also refer to a composite high voltage enhancement mode transistor that is formed by connecting the group III-V or the GaN transistor in cascode with a lower voltage group IV transistor. While PQFN package 100 provides a full bridge power device, alternative implementations can provide other package configurations as required by the particular application.

In PQFN package 100, HIN1, HIN2, and HIN3 are control signals for U-phase power switch 104a, V-phase power switch 106a, and W-phase power switch 108a, which are high side transistors. Driver IC 102 generates high side gate signals H1, H2, and H3 from HIN1, HIN2, and HIN3 respectively, which are then provided to U-phase power switch 104a, V-phase power switch 106a, and W-phase power switch 108a, as shown in FIG. 1A. Similarly, LIN1, LIN2, and LIN3 are control signals for U-phase power switch 104b, V-phase power switch 106b, and W-phase power switch 108b, which are low side transistors. Driver IC 102 generates low side gate signals L1, L2, and L3 from LIN1, LIN2, and LIN3 respectively, which are then provided to U-phase power switch 104b, V-phase power switch 106b, and W-phase power switch 108b, as shown in FIG. 1A. EN can be used, for example by microcontroller 124, to enable switching of driver IC 102. More particularly, driver IC 102 is configured to enable switching of H1, H2, H3, L1, L2, and L3 responsive to EN.

VBUS is a bus voltage from bus voltage source 114, which is coupled to respective drains of U-phase power switch 104a, V-phase power switch 106a, and W-phase power switch 108a. As one example, bus voltage source 114 can be an AC to DC rectifier. The AC can be, as one example, an outlet voltage, such as 230 volts. The DC voltage can be, for example, approximately 300 volts to approximately 400 volts for VBUS.

VCC is a supply voltage for driver IC 102 from supply voltage source 116, which can be approximately 15 volts. In some implementations, supply voltage source 116 generates VCC from VBUS. VB1, VB2, and VB3 are bootstrap voltages for driver IC 102 and are provided by bootstrap capacitors CB1, CB2, and CB3 respectively. Bootstrap capacitors CB1, CB2, and CB3 can be charged, for example, by VCC through driver IC 102. Bootstrap capacitor CB1 is coupled between VB1 terminal 112r and SW3 terminal 112q. Bootstrap capacitor CB2 is coupled between VB2 terminal 112s and SW2 terminal 112p. Bootstrap capacitor CB3 is coupled between VB3 terminal 112t and SW1 terminal 112o.

VSS is a logic ground for driver IC 102 from logic ground $G_{VSS}$. VCOM is a power ground for driver IC 102 from power ground $G_{COM}$. Thus, in the present implementation, PQFN package 100 has separate grounds for logic and power. Using separate grounds for logic and power, PQFN package 100 is protected from latch up and noise malfunction, which otherwise can be caused by excess switching voltages from U-phase power switches 104a and 104b, V-phase power switches 106a and 106b, and W-phase power switches 108a and 108b. It should be noted that in some implementations, PQFN package 100 has a shared ground for logic and power. In these implementations, PQFN package 100 may have a single I/O terminal for ground.

Separate logic and power grounds are provided for in multi-phase power inverter circuit 150 using shunt resistor RS. Shunt resistor RS is coupled across VSS terminal 112m and VCOM terminal 112n. Shunt resistor RS is also coupled to sources of each of U-phase power switch 104b, V-phase power switch 106b, and W-phase power switch 108b through VCOM terminal 112n. Thus, motor current $I_M$ from motor 126, shown in FIG. 1A, is combined phase current from U-phase power switch 104b, V-phase power switch 106b, and W-phase power switch 108b. Motor current $I_M$ is provided to microcontroller 124 through IM terminal 112l. Microcontroller 124 utilizes motor current $I_M$ to reconstruct individual phase currents (U, V, and W) to control pulse-width modulation (PWM) by controlling HIN1, HIN2, HIN3, LINT, LIN2, and LIN3.

As shown in FIG. 1A, motor current $I_M$ is also provided to driver IC 102 as ITRIP. Driver IC 102 utilizes ITRIP for overcurrent protection. For example ITRIP is compared to a reference value. If ITRIP exceeds the reference value, driver IC 102 detects an overcurrent condition. Furthermore, driver IC 102 indicates the overcurrent condition to microcontroller 124 by providing FAULT to FAULT terminal 112j. Driver IC 102 utilizes RCIN to automatically reset from the overcurrent protection. As shown in FIG. 1B, resistor R1 is coupled between VCC terminal 112b and RCIN terminal 112k to charge capacitor C1. Capacitor C1 is coupled between RCIN terminal 112k and VSS terminal 112m. Resistor R1 and capacitor C1 can be changed to alter timing of automatic reset for the overcurrent protection.

Typical QFN packages have limited complexity with simple configurations and a small number of electrical components. For more complex configurations, it would be difficult to rout wires for connections while avoiding wire crossing and wire shorting. Moreover, long lengths of wiring would adversely affect electrical and thermal performance. However, PQFN packages, in accordance with various implementations of the present disclosure, can be substantially more complex than typical QFN packages while avoiding wire crossing and wire shorting and achieving high electrical and thermal performance.

Figure 2A:
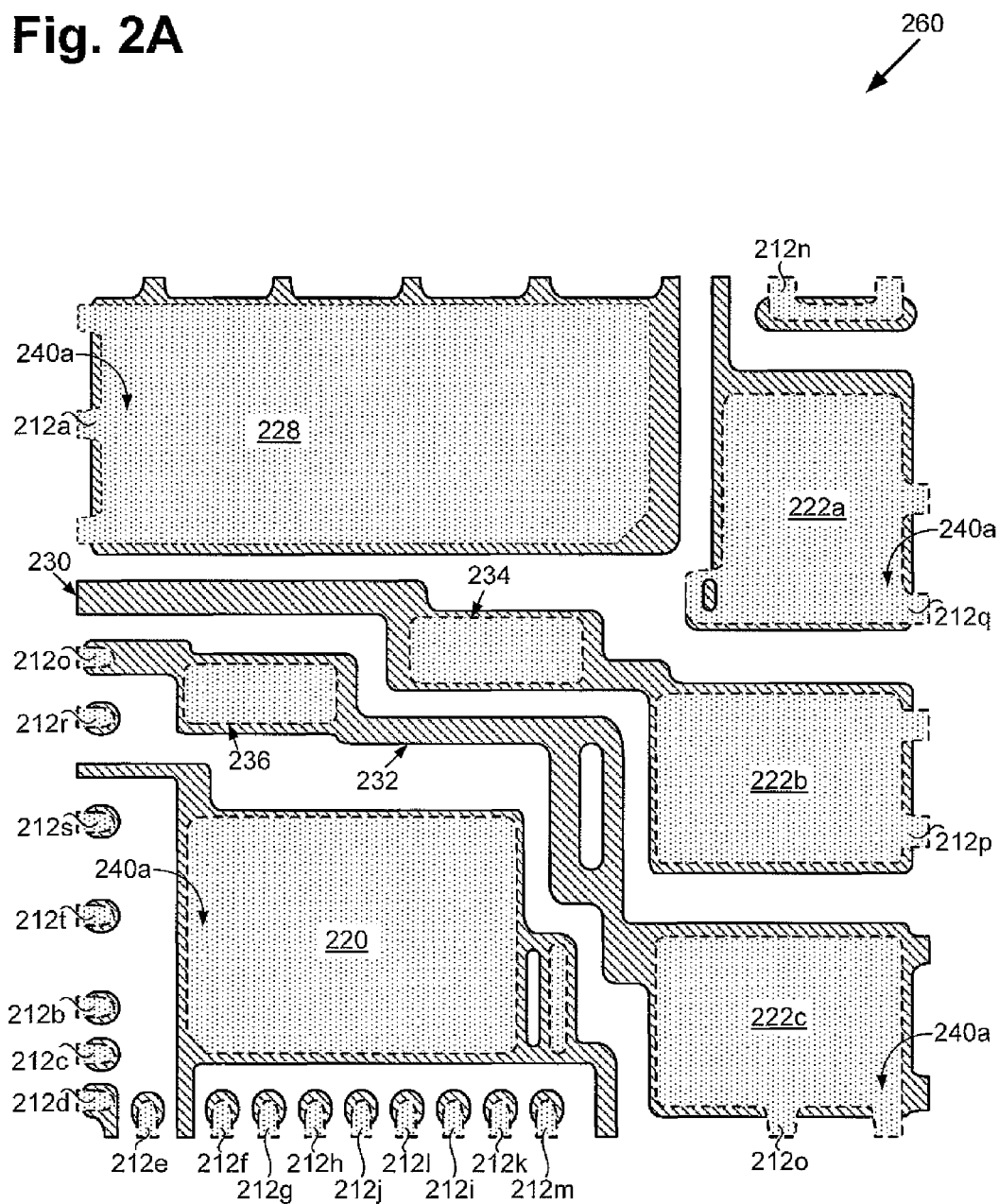
FIG. 2A illustrates a top-plan view of a leadframe of an exemplary PQFN package.
Figure 2B:
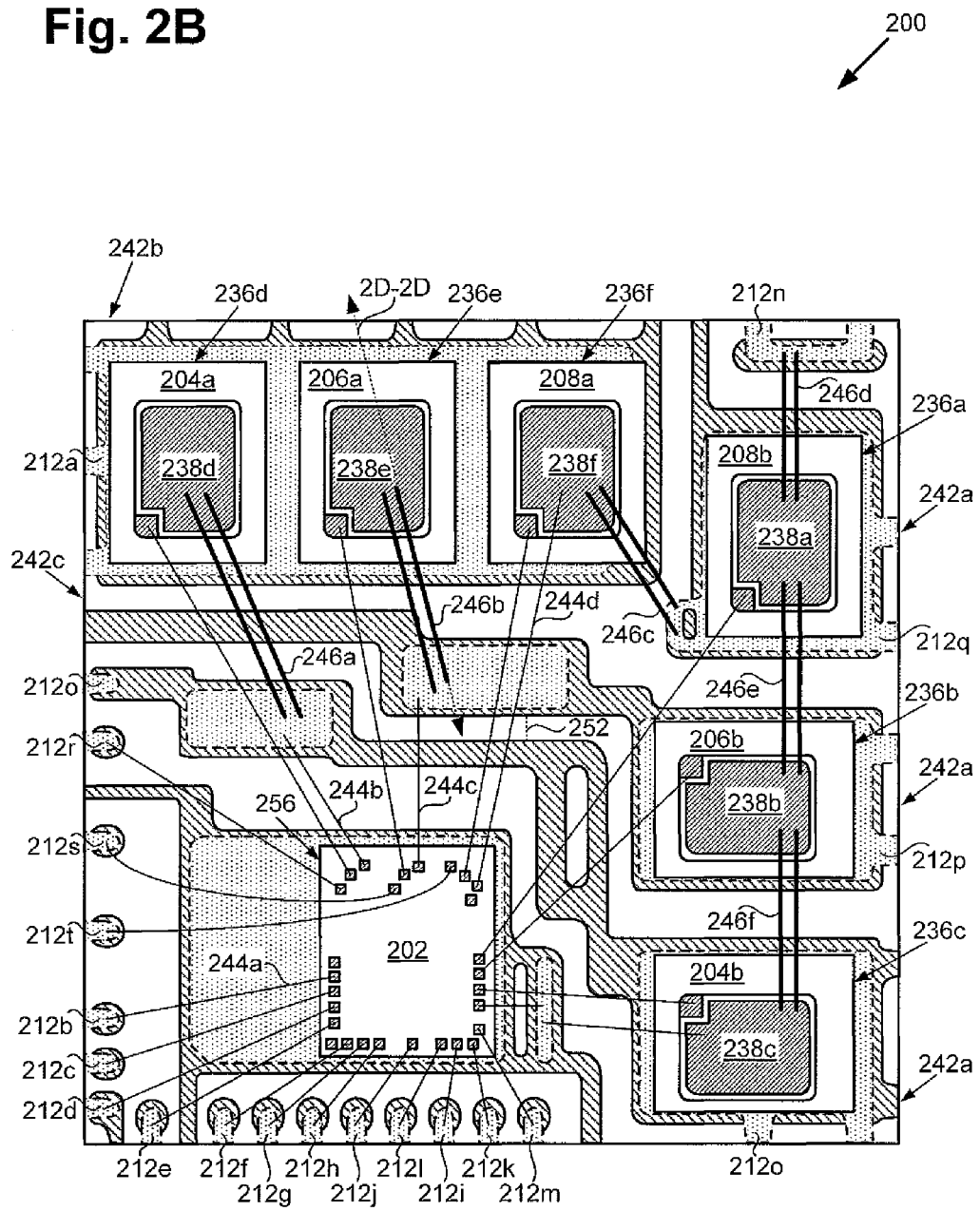
FIG. 2B illustrates a top-plan view of an exemplary PQFN package with wirebonds.
Figure 2C:
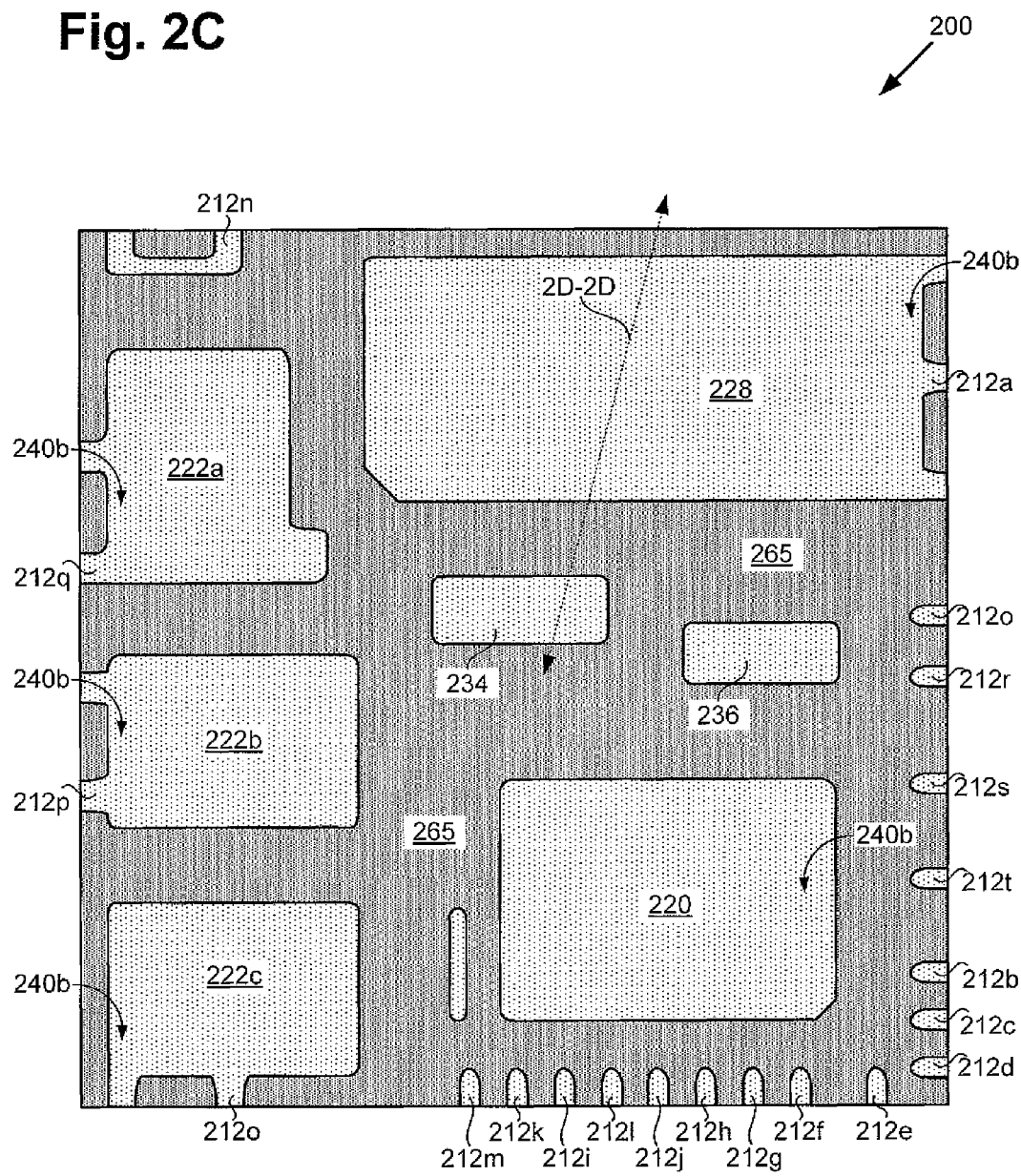
FIG. 2C illustrates a bottom-plan view of an exemplary PQFN package.

Turning to FIGS. 2A, 2B, and 2C, FIG. 2A illustrates a top-plan view of a leadframe of PQFN package 200 of FIGS. 2B and 2C. FIG. 2B illustrates a top-plan view of PQFN package 200. FIG. 2C illustrates a bottom-plan view of PQFN package 200. In the present implementation, PQFN package 200 is a multi-chip module (MCM) PQFN package, which can have a footprint of approximately 12 mm by approximately 12 mm. In other implementations, PQFN package 200 can have a footprint of greater than 12 mm by 12 mm. In still other implementations, PQFN package 200 can have a footprint of less than 12 mm by 12 mm.

PQFN package 200 corresponds to PQFN package 100 in FIGS. 1A and 1B. For example, PQFN package 200 includes driver IC 202, U-phase power switches 204a and 204b, V-phase power switches 206a and 206b, and W-phase power switches 208a and 208b corresponding respectively to driver IC 102, U-phase power switches 104a and 104b, V-phase power switches 106a and 106b, and W-phase power switches 108a and 108b in FIG. 1A. Furthermore, PQFN package 200 includes VBUS terminal 212a, VCC terminal 212b, HIN1 terminal 212c, HIN2 terminal 212d, HIN3 terminal 212e, LIN1 terminal 212f, LIN2 terminal 212g, LIN3 terminal 212h, EN terminal 212i, FAULT terminal 212j, RCIN terminal 212k, IM terminal 212l, VSS terminal 212m, VCOM terminal 212n, SW1 terminal 212o (also referred to as "U-phase output terminal 212o"), SW2 terminal 212p (also referred to as "V-phase output terminal 212p"), SW3 terminal 212q (also referred to as "W-phase output terminal 212q"), VB1 terminal 212r, VB2 terminal 212s, and VB3 terminal 212t (also referred to as "I/O terminals 212") corresponding respectively to VBUS terminal 112a, VCC terminal 112b, HINT terminal 112c, HIN2 terminal 112d, HIN3 terminal 112e, LIN1 terminal 112f, LIN2 terminal 112g, LIN3 terminal 112h, EN terminal 112i, FAULT terminal 112j, RCIN terminal 112k, IM terminal 112l, VSS terminal 112m, VCOM terminal 112n, SW1 terminal 112o, SW2 terminal 112p, SW3 terminal 112q, VB1 terminal 112r, VB2 terminal 112s, and VB3 terminal 112t in PQFN package 100.

FIG. 2A shows leadframe 260 including driver IC die pad 220, W-phase die pad 222a, V-phase die pad 222b, U-phase die pad 222c, and common die pad 228. Lead frame 260 further includes leadframe strips 230 and 232 and I/O terminals 212. Leadframe island 234 is on leadframe strip 230 of leadframe 260 and leadframe strip 230 is electrically and mechanically connected (e.g. integrally connected) to V-phase die pad 222b of leadframe 260. Leadframe island 236 is on leadframe strip 232 of leadframe 260 and leadframe strip 232 is electrically and mechanically connected (e.g. integrally connected) to U-phase die pad 222c of leadframe 260. As shown in FIG. 2B, leadframe strips 230 and 232 can optionally extend to edge 242c of PQFN package 200. In doing so, any of leadframe strips 230 and 232 can provide, for example, additional I/O terminals for PQFN package 200. For example, leadframe strip 232 is shown as providing an additional SW1 terminal 212o at edge 242c of PQFN package 200.

Leadframe 260 can comprise a material with high thermal and electrical conductivity such as copper (Cu) alloy C194 available from Olin Brass®. Top-side 240a of leadframe 260 can be selectively plated with materials for enhanced adhesion to device dies and wires. The plating can comprise silver (Ag) plating that is selectively applied to leadframe 260, which is available from companies such as QPL Limited.

FIGS. 2A and 2B show that leadframe 260 is an etched leadframe, such as a half-etched leadframe. Portions of leadframe 260, which are unetched (e.g. not half-etched) are indicated in FIGS. 2A and 2B using dashed lines. Leadframe islands 234 and 236 are examples of such unetched portions. For example, FIG. 2C shows bottom-side 240b of leadframe 260 (which also corresponds to a bottom-side of PQFN package 200). FIG. 2C further shows mold compound 265 of PQFN package 200, which covers etched portions of leadframe 260. Mold compound 265 can be a plastic that has a low flexural modulus, such as CEL9220ZHF10 (v79) available from Hitachi® Chemical. To provide resilience against package cracking, the height (or thickness) of PQFN package 200 as defined by mold compound 265 may be kept thin, such as 0.9 mm or less. I/O terminals 212, leadframe island 234 and leadframe island 236 are unetched and are exposed through mold compound 265 on bottom-side 240b of leadframe 260 (which also corresponds to a bottom-side of PQFN package 200). As such, I/O terminals 212, leadframe island 234 and leadframe island 236 are exposed on bottom-side 240b of leadframe 260 for high electrical conductivity and/or thermal dissipation. By providing a (PCB) with matching lands, this feature can be exploited. The exposed areas of leadframe 260 can be plated, for example with Tin (Sn).

Driver IC 202, U-phase power switches 204a and 204b, V-phase power switches 206a and 206b, and W-phase power switches 208a and 208b are interconnected utilizing wirebonds and leadframe 260.

FIG. 2B shows that U-phase power switches 204a and 204b, V-phase power switches 206a and 206b, W-phase power switches 208a and 208b, and driver IC 202 are electrically and mechanically connected to leadframe 260. This can be accomplished utilizing solder or conductive adhesive, such as silver filled QMI 529HT available from Henkel Corporation.

As shown in FIG. 2B, U-phase power switch 204b, V-phase power switch 206b, and W-phase power switch 208b are situated along edge 242a of PQFN package 200. W-phase power switch 208b is situated on W-phase die pad 222a. More particularly, drain 236a of W-phase power switch 208b is situated on W-phase die pad 222a. Similarly, V-phase power switch 206b is situated on V-phase die pad 222b. More particularly, drain 236b of V-phase power switch 206b is situated on V-phase die pad 222b. Also, U-phase power switch 204b is situated on U-phase die pad 222c. More particularly, drain 236c of U-phase power switch 204b is situated on U-phase die pad 222c. Thus, U-phase power switch 204b, V-phase power switch 206b, and W-phase power switch 208b are individually coupled to respective die pads of leadframe 260. As such, W-phase die pad 222a can correspond to W-phase output terminal 212q of PQFN package 200, V-phase die pad 222b can correspond to V-phase output terminal 212p of PQFN package 200, and U-phase die pad 222c can correspond to U-phase output terminal 212o of PQFN package 200, as shown in FIG. 2B.

Also shown in FIG. 2B, U-phase power switch 204a, V-phase power switch 206a, and W-phase power switch 208a are situated along edge 242b of PQFN package 200, which intersects edge 242a. U-phase power switch 204a, V-phase power switch 206a, and W-phase power switch 208a are situated on common die pad 228. More particularly, drain 236d of U-phase power switch 204a, drain 236e of V-phase power switch 206a, and drain 236f of W-phase power switch 208a are situated on common die pad 228 of leadframe 260. Thus, common die pad 228 can correspond to VBUS terminal 212a (e.g. a bus voltage input terminal) of PQFN package 200, as shown in FIG. 2B.

Figure 2D:
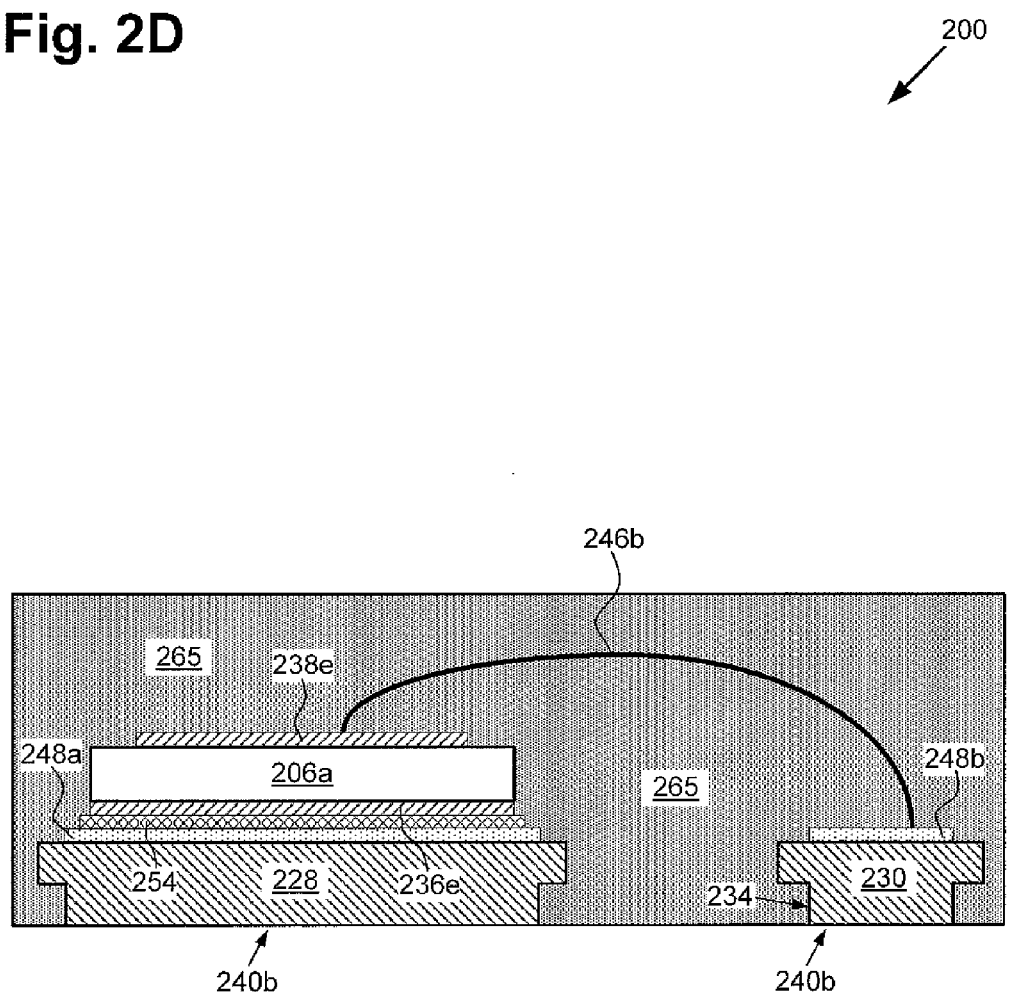
FIG. 2D illustrates a cross sectional view of a portion of an exemplary PQFN package.

An example of this configuration is shown in more detail in FIG. 2D. FIG. 2D illustrates a cross sectional view of a portion of PQFN package 200. The cross sectional view in FIG. 2D corresponds to cross section 2D-2D, of FIGS. 2B and 2C. FIG. 2D shows drain 236e of V-phase power switch 206a connected to common die pad 228 through conductive adhesive 254 and plating 248a of leadframe 260. Conductive adhesive 254 can include silver filled adhesive such as QMI 529HT. Other dies in PQFN package 200 can similarly be connected to leadframe 260.

As shown in FIG. 2B, driver IC 202 is situated on driver IC die pad 220. More particularly, ground 256 of driver IC 202 is situated on driver IC die pad 220 of leadframe 260. Driver IC die pad 220 is larger than driver IC 202 and can therefore accommodate different, larger driver ICs, which may have different features than driver IC 202.

FIG. 2B also shows that wirebonds, such as wirebond 244a electrically and mechanically connect driver IC 202 to VCC terminal 212b, HIN1 terminal 212c, HIN2 terminal 212d, HIN3 terminal 212e, LIN1 terminal 212f, LIN2 terminal 212g, LIN3 terminal 212h, EN terminal 212i, FAULT terminal 212j, RCIN terminal 212k, IM terminal 212l, VSS terminal 212m, VB1 terminal 212r, VB2 terminal 212s, VB3 terminal 212t, and to respective gates of U-phase power switches 204a and 204b, V-phase power switches 206a and 206b, and W-phase power switches 208a and 208b.

Wirebond 244a and similarly depicted wirebonds in FIG. 2B can include, for example, 1.3 mil diameter G1 type Gold (Au) wires. Thicker wires can be utilized for power connections, such as wirebonds 246a, 246b, 246c, 246d, 246e, and 246f (also referred to as "wirebonds 246"). Wirebonds 246 can be, for example, 2.0 mil diameter copper (Cu) wires, such as Maxsoft® LD wires available from Kulicke & Soffa®. Wirebonds 246 can be bonded using bond stitch on ball (BSOB) bonding. As shown in FIG. 2B, multiple wirebonds, such as two wirebonds, can be in parallel with wirebonds 246 to for additional current handling.

In FIG. 2B, wirebond 246f electrically and mechanically connects source 238c of U-phase power switch 204b and source 238b of V-phase power switch 206b. Wirebond 246e electrically and mechanically connects source 238b of V-phase power switch 206b and source 238a of W-phase power switch 208b. Wirebond 246d electrically and mechanically connects source 238a of W-phase power switch 208b and VCOM terminal 212n. It is noted that in other implementations, such as open source implementations of PQFN package 200, sources 238a, 238b, and 238c are coupled to respective terminals using respective wirebonds. In other words, sources 238a, 238b, and 238c are not shorted to one another in PQFN package 200.

Also in FIG. 2B, wirebond 246a electrically and mechanically connects source 238d of U-phase power switch 204a to leadframe 260. More particularly, source 238d is connected via wirebond 246a to leadframe island 236 of leadframe strip 232. Thus, U-phase output node 110a of FIG. 1A is situated on leadframe strip 232 of leadframe 260, where leadframe strip 232 is connected to U-phase die pad 222c of leadframe 260. As such, PQFN package 200 has significant flexibility in arranging wirebond 246a, and other wirebonds, such as wirebond 244b, while avoiding wire shorts due to wire crossing and achieving high electrical and thermal performance. Wirebond 244b electrically and mechanically connects driver IC 202 and leadframe strip 232 of leadframe 260 at leadframe island 236 to provide SW1 to driver IC 202 as shown in FIG. 1A. U-phase output node 110a of FIG. 1A is also situated on leadframe island 236 of leadframe 260. As leadframe island 236 is exposed on bottom-side 240b of PQFN package 200 (shown in FIG. 2C), heat generated at U-phase output node 110a can be effectively dissipated from PQFN package 200.

Similarly, wirebond 246b electrically and mechanically connects source 238e of V-phase power switch 206a to leadframe 260. FIG. 2D illustrates one example of this connection. Source 238e is connected via wirebond 246b to leadframe island 234 of leadframe strip 230 through plating 248b of leadframe 260. Leadframe strip 230 then connects to drain 236b of V-phase power switch 206b through V-phase die pad 222b. A similar connection can be employed for connecting source 238d to drain 236c of U-phase power switch 204b. Wirebond 246b electrically and mechanically connects source 238e of V-phase power switch 206a to leadframe strip 230 at leadframe island 234. Thus, V-phase output node 110b of FIG. 1A is situated on leadframe strip 230 of leadframe 260, where leadframe strip 230 is connected to V-phase die pad 222b of leadframe 260. As such, PQFN package 200 has significant flexibility in arranging wirebond 246b, and other wirebonds, such as wirebond 244c, while avoiding wire shorts due to wire crossing and achieving high electrical and thermal performance. Wirebond 244c electrically and mechanically connects driver IC 202 and leadframe strip 230 of leadframe 260 at leadframe island 234 to provide SW2 to driver IC 202 as shown in FIG. 1A. V-phase output node 110b of FIG. 1A is also situated on leadframe island 234 of leadframe 260. As leadframe island 234 is exposed on bottom-side 240b of PQFN package 200 (shown in FIG. 2C), heat generated at V-phase output node 110b can be effectively dissipated from PQFN package 200.

Wirebond 246c electrically and mechanically connects source 238f of W-phase power switch 208a to leadframe 260. More particularly, wirebond 246b electrically and mechanically connects source 238f of W-phase power switch 208a to W-phase die pad 222a on leadframe 260. Thus, W-phase output node 110c of FIG. 1A is situated on W-phase die pad 222a of leadframe 260 with W-phase power switch 208b. As W-phase power switch 208b is adjacent to W-phase power switch 208a, source 238f of W-phase power switch 208a can be coupled to drain 236a of W-phase power switch 208b while easily avoiding wire shorts due to wire crossing and achieving high electrical and thermal performance. This can be accomplished without utilizing a leadframe strip and/or leadframe island. Thus, PQFN package 200 can be made significantly smaller while avoiding arcing between U-phase output node 110a, V-phase output node 110, and W-phase output node 110c. For example, an additional leadframe strip and/or leadframe island would require a larger PQFN package 200 to maintain sufficient spacing 252 between leadframe strips 230 and 232 so as to prevent arcing (e.g. at least 1 mm). Furthermore, this configuration does not significantly impact flexibility in arranging wirebonds in PQFN package 200. Also, as W-phase die pad 222a is exposed on bottom-side 240b of PQFN package 200 (shown in FIG. 2C), heat generated at W-phase output node 110c can be effectively dissipated from PQFN package 200. Wirebond 244d electrically and mechanically connects driver IC 202 and source 238f to provide SW3 to driver IC 202 as shown in FIG. 1A.

Thus, in various implementations, a PQFN package includes at least one of a leadframe island and a leadframe strip. It is noted that the PQFN package can include the leadframe island without the leadframe strip. For example, leadframe island 234 can be connected to V-phase die pad 222b through a trace on a PCB. It is further noted that the PQFN package can include the leadframe strip without the leadframe island. However, having the leadframe strip with the leadframe island can offer significant flexibility in arranging wirebonds in the PQFN package while achieving high electrical and thermal performance. Thus, the PQFN package can readily support complex configurations, which may include a large number of electrical components.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power quad flat no-lead (PQFN) package comprising:
   a U-phase output node situated on a first leadframe island of a leadframe;
   a V-phase output node situated on a second leadframe island of said leadframe;
   a W-phase output node situated on a W-phase die pad of said leadframe;
   wherein said first leadframe island is on a corresponding first leadframe strip, said corresponding first leadframe strip being connected to a U-phase die pad.

2. The PQFN package of claim 1, comprising a first W-phase power switch situated on said W-phase die pad.

3. The PQFN package of claim 1, comprising at least one wirebond connected to said W-phase die pad.

4. The PQFN package of claim 2, comprising at least one wirebond connecting a source of a second W-phase power switch to said W-phase die pad.

5. The PQFN package of claim 1, comprising at least one wirebond connected to said first leadframe island of said leadframe.

6. The PQFN package of claim 1, comprising at least one wirebond connected to said second leadframe island of said leadframe.

7. The PQFN package of claim 1, wherein said first leadframe island is exposed on a bottom-side of said PQFN package.

8. The PQFN package of claim 1, wherein said second leadframe island is exposed on a bottom-side of said PQFN package.

9. The PQFN package of claim 1, wherein said W-phase die pad is a W-phase output terminal of said PQFN package.

10. The PQFN package of claim 1, wherein said second leadframe island is on a corresponding second leadframe strip of said leadframe, said corresponding second leadframe strip connected to a V-phase die pad.

11. The PQFN package of claim 1, comprising a first U-phase power switch situated on a U-phase die pad of said leadframe and a first V-phase power switch situated on a V-phase die pad of said leadframe.

12. The PQFN package of claim 11, comprising a second U-phase power switch, a second V-phase power switch, and a second W-phase power switch situated on a common die pad of said leadframe.

13. The PQFN package of claim 12, wherein said U-phase, V-phase, and W-phase power switches comprise group 111-V transistors.

14. The PQFN package of claim 1, wherein said PQFN package has a footprint of greater than 12 mm by 12 mm.

15. The PQFN package of claim 1, wherein said PQFN package has a footprint of less than 12 mm by 12 mm.

16. A power quad flat no-lead (PQFN) package comprising:
   a U-phase output node situated on a first leadframe island;
   wherein said first leadframe island is on a corresponding first leadframe strip, said corresponding first leadframe strip being connected to a U-phase die pad;
   a V-phase output node situated on a second leadframe strip of said leadframe, said second leadframe strip connected to a V-phase die pad of said leadframe;
   a W-phase output node situated on a W-phase die pad of said leadframe.

17. The PQFN package of claim 16, comprising a first W-phase power switch situated on said W-phase die pad.

18. The PQFN package of claim 16, wherein said W-phase die pad is a W-phase output terminal of said PQFN package.

19. The PQFN package of claim 16, comprising at least one wirebond connected to said W-phase die pad.

* * * * *